United States Patent [19]

Nishiwaki et al.

[11] Patent Number: 5,236,793
[45] Date of Patent: Aug. 17, 1993

[54] MATERIAL FOR COLOR FILTER OVERCOAT AND MATERIAL FOR COLOR FILTER USEFUL FOR LIQUID CRYSTAL DISPLAY, PROCESS FOR FORMATION OF OVERCOAT AND PROCESS FOR FORMATION OF COLOR FILTER

[75] Inventors: Kenichi Nishiwaki, Daito; Shuji Matsushima, Osaka; Kenzo Fukuyoshi, Tamana; Toyoshi Nishimoto, Omihachiman, all of Japan

[73] Assignee: Okuno Chemical Industries Co., Ltd., Japan

[21] Appl. No.: 828,937

[22] PCT Filed: Jun. 4, 1991

[86] PCT No.: PCT/JP91/00749
§ 371 Date: Feb. 6, 1992
§ 102(e) Date: Feb. 6, 1992

[87] PCT Pub. No.: WO91/19212
PCT Pub. Date: Dec. 12, 1991

[30] Foreign Application Priority Data

Jun. 6, 1990 [JP] Japan .................. 2-148928

[51] Int. Cl.$^5$ .......................... G02B 1/04; G03L 1/72
[52] U.S. Cl. .......................... 430/20; 430/7; 430/321; 430/325; 430/961; 359/68
[58] Field of Search ............ 430/20, 7, 321, 961, 430/325; 428/1; 359/68

[56] References Cited

U.S. PATENT DOCUMENTS

| 4,357,415 | 11/1982 | Hartman | 430/293 |
| 4,934,791 | 6/1990 | Shimizu et al. | 359/68 |
| 5,045,418 | 9/1991 | Fukuyoshi | 430/7 |

FOREIGN PATENT DOCUMENTS

| 60-129739 | 7/1985 | Japan . | |
| 61-141401 | 6/1986 | Japan . | |
| 61-292604 | 12/1986 | Japan . | |
| 62-006254 | 1/1987 | Japan . | |
| 62-017729 | 1/1987 | Japan . | |
| 63-129302 | 6/1988 | Japan | 430/7 |
| 63-129322 | 6/1988 | Japan | 430/20 |
| 63-131103 | 6/1988 | Japan | 359/68 |
| 2-024602 | 1/1990 | Japan . | |

Primary Examiner—Charles L. Bowers, Jr.
Assistant Examiner—John A. McPherson
Attorney, Agent, or Firm—Larson and Taylor

[57] ABSTRACT

The invention provides a material for overcoat on a color filter for liquid crystal display, characterized in that the material comprises a water-soluble photopolymerizable substance, a cationically polymerizable, water-insoluble photopolymerizable substance, a photopolymerization initiator and a precursor of photo-setting catalyst, and a material for a color filter which comprises a mixture of the material for overcoat and a coloring agent.

The invention also provides a process for forming an overcoat on a color filter, or for forming a color filter characterized in that the process comprises the steps of applying the material for color filter overcoat or the material for a color filter, subjecting the coating to exposure to light and performing development using an aqueous solution of alkali.

10 Claims, 2 Drawing Sheets

MATERIAL FOR COLOR FILTER OVERCOAT AND MATERIAL FOR COLOR FILTER USEFUL FOR LIQUID CRYSTAL DISPLAY, PROCESS FOR FORMATION OF OVERCOAT AND PROCESS FOR FORMATION OF COLOR FILTER

FIELD OF THE INVENTION

The present invention relates to a material for forming an overcoat on a color filter and a material for forming a color filter to be used for liquid crystal display devices, a process for forming the overcoat, and a process for forming the color filter.

BACKGROUND ART

Liquid crystal display devices have the features of, e.g., being electrically operated at a low voltage and operated with a low electric power, having color display and providing a display area in the range of from several millimeters square to tens meters square. In recent years, research and development have been in rapid progress to put to practical use liquid crystal display devices with color display and large-size display. These liquid crystal display devices are required to have a high picture element density, the formation of fine patterns of transparent electrode having a pitch of about 100 μm, a high reliability, etc.

An electrode plate having a transparent electrode formed on a color filter in a color liquid crystal display device is excellent in the operability of liquid crystal and the quality of display. In such display devices, an overcoat of organic resin is usually formed between a color filter and a transparent electrode in patterning the transparent electrode by etching.

The overcoat is formed to make the color filter flat and to protect the filter, and thus must have a high adhesion to a transparent electrode, compatibility with the process of patterning a transparent electrode, resistance to heat, resistance to acids, resistance to alkalis, etc.

Conventional overcoats are usually formed from a resin of the same type as used for a color filter in view of the adhesion to the color filter. However, substantially all species of resins used for color filters have the drawbacks of, for example, exhibiting low resistance to heat in the formation of transparent electrode, thereby causing wrinkles and blisters.

Known among methods of forming a patterned overcoat is a method in which an overcoat is produced from a photosensitive resin and then developed with an organic solvent. This method employs an organic solvent as a developer, which is difficult to handle and makes the working environment unfavorable. Also known is a method in which an overcoat of photosensitive resin is exposed to light and developed with an aqueous solution of alkali. The overcoats formed from photosensitive resins conventionally used in such method are not fully satisfactory in properties such as resistance to water and heat.

DISCLOSURE OF THE INVENTION

In view of the foregoing problems of the prior art, the inventors conducted research and found the following. Using a material for overcoat comprising a water-soluble photopolymerizable substance, a cationically polymerizable, water-insoluble photopolymerizable substance, a photopolymerization initiator and a precursor of photo-setting catalyst, a patterned overcoat can be easily formed by applying the material to the surface of a filter, curing the overcoat by exposure to light, and developing the unexposed portion of overcoat with an aqueous solution of alkali. The overcoat thus formed is excellent in the adhesion to the transparent electrode and the color filter and is improved in the resistance to water, acids, alkalis and heat without impairing the spectral characteristics nor the color of color filter. A further discovery was that when the development is conducted by a method using an aqueous solution of organic alkali or by a method comprising dipping in an aqueous solution of organic alkali after development with an aqueous solution of inorganic alkali, the overcoat thus obtained is further improved in the resistance to heat and chemicals.

Another finding was that when a coloring agent is incorporated into the foregoing material for overcoat, a material for a color filter can be obtained which is capable of easily forming a color pattern having high resistance to water, acids, alkalis and heat.

The present invention provides a material for overcoat on a color filter and a material for a color filter both useful for liquid crystal display, a process for forming the overcoat, and a process for forming the color filter, which are described below.

(1) A material for overcoat on a color filter for liquid crystal display, characterized in that the material comprises a water-soluble photopolymerizable substance, a cationically polymerizable, water-insoluble photopolymerizable substance, a photopolymerization initiator and a precursor of photo-setting catalyst.

(2) A process for forming an overcoat on a color filter for liquid crystal display, characterized in that the process comprises the steps of applying a material for overcoat to a transparent substrate having a color filter formed thereon, subjecting the overcoat to exposure to light and performing development using an aqueous solution of alkali, the material for overcoat comprising a water-soluble photopolymerizable substance, a cationically polymerizable, water-insoluble photopolymerizable substance, a photopolymerization initiator and a precursor of photo-setting catalyst.

(3) A material for a color filter for liquid crystal display, characterized in that the material comprises a water-soluble photopolymerizable substance, a cationically polymerizable, water-insoluble photopolymerizable substance, a photopolymerization initiator, a precursor of photo-setting catalyst and a coloring agent.

(4) A process for forming a color filter for liquid crystal display, characterized in that the process comprises the steps of applying a material for a color filter to a transparent substrate, subjecting the coating to exposure to light, and conducting development with an aqueous solution of alkali, the material for a color filter comprising a water-soluble photopolymerizable substance, a cationically polymerizable, water-insoluble photopolymerizable substance, a photopolymerization initiator, a precursor of photo-setting catalyst and a coloring agent.

The material for color filter overcoat according to the invention contains two photopolymerizable substances, i.e. a water-soluble photopolymerizable substance and a cationically polymerizable, water-insoluble photopolymerizable substance. The conjoint use of two kinds of photopolymerizable substances enables development of overcoat with an aqueous solution of alkali after exposure to light and results in the formation of a highly water-resistant overcoat.

The water-soluble photopolymerizable substance is indispensable to develop the overcoat with an aqueous solution of alkali after exposure to light. As to water-soluble photopolymerizable substances, radically polymerizable substances are usable. Such substances include, for example, a product prepared by reacting a saturated or unsaturated polybasic acid anhydride with a reaction product of an epoxy compound and an unsaturated monocarboxylic acid. Examples of useful epoxy compounds are epoxy resins such as those of bisphenol A type, bisphenol S type, bisphenol F type, phenol novolak type and cresol novolak type, alicyclic epoxy resins, etc. Examples of useful unsaturated monocarboxylic acids are acrylic acid, methacrylic acid, crotonic acid, etc. Examples of useful polybasic acid anhydrides are succinic anhydride, maleic anhydride, phthalic anhydride, itaconic anhydride, hexahydrophthalicanhydride, endomethylenetetrahydrophthalic anhydride, chlorendic anhydride and like dibasic acid anhydrides, pyromellitic anhydride, trimellitic anhydride and like aromatic polycarboxylic anhydrides, etc. Useful water-soluble photopolymerizable substances also include polymers having carboxyl or hydroxyl groups in the skeleton as well as said reaction product. These substances are usable singly or at least two of them can be used in mixture in a desired ratio.

The molecular weight of the water-soluble photopolymerizable substance is not specifically limited. Yet preferred substances are those having a weight-average molecular weight in the range of about 1000 to about 100000.

Useful cationically polymerizable, water-insoluble photopolymerizable substances include, for example, those containing epoxy groups. Use of cationically polymerizable substance enables the progress of photo-setting without quenching due to oxygen. Examples of useful cationically polymerizable, water-insoluble photopolymerizable substances are bisphenol A type epoxy resins, bisphenol S type epoxy resins, bisphenol F type epoxy resins, phenol novolak type epoxy resins, cresol novolak type epoxy resins, alicyclic epoxy resins, etc. Also usable are photo-reactive polymers having epoxy and acryloyl (methacryloyl) groups. These substances are usable singly or at least two of them can be used in mixture in a desired ratio.

The molecular weight of the cationically polymerizable, water-insoluble photopolymerizable substance is not specifically limited. Yet preferred substances are those having a weight-average molecular weight in the range of about 1000 to about 100000.

As to the proportions of the photopolymerizable substances, the cationically polymerizable, water-insoluble photopolymerizable substance is used in the proportion of about 5 to about 100 parts by weight, preferably about 10 to about 50 parts by weight, per 100 parts by weight of the water-soluble photopolymerizable substance.

The photopolymerization initiator acts as an initiator for the polymerization of radically polymerizable substance. Useful photopolymerization initiators include those usually used in photopolymerization among which preferred are those which exhibit a high storage stability after mixing with other components. Examples of such photopolymerization initiators are benzoinethyl ether, benzoinbutyl ether and like benzoinalkyl ether type initiators, 2,2-diethoxyacetophenone, 4-phenoxy-2,2-dichloroacetophenone and like acetophenone type initiators, 4-isopropyl-2-hydroxy-2methylpropiophenone and like propiophenone type initiators, benzyldimethylketal, 2-ethylanthraquinone, 2-chloroanthraquinone and like anthraquinone type initiators, 2-chlorothioxanthone, 2,4-dimethylthioxanthone and like thioxanthone type initiators, etc. These photopolymerization initiators are usable singly or at least two of them can be used in mixture in a desired ratio.

The proportion of the photopolymerization initiator is about 0.1 to about 30 parts by weight, preferably about 5 to about 20 parts by weight, per 100 parts by weight of the combined amount of the water-soluble photopolymerizable substance and the cationically polymerizable, water-insoluble photopolymerizable substance.

A photopolymerization accelerator such as ethyl p-dimethylaminobenzoate, isoamyl p-dimethylaminobenzoate, etc. can be used in combination with the photopolymerization initiator. In this case, the photopolymerization accelerator is used in an amount of about 50 to about 200 parts by weight, preferably about 50 to about 150 parts by weight, per 100 parts by weight of the photopolymerization initiator.

The precursor of photo-setting catalyst is caused on irradiation with light to produce a Lewis acid which initiates the reaction of epoxy group. The precursor acts as the polymerization catalyst for the cationically polymerizable, water-insoluble photopolymerizable substance. Examples of such precursors of photo-setting catalysts are diphenyliodonium hexafluoroantimonate, diphenyliodonium hexafluorophosphate and like diaryliodonium salts, triphenylsulfonium tetrafluoroborate, triphenylsulfonium hexafluoroantimonate and like triarylsulfonium salts, triphenylselenium hexafluorophosphate, triphenylselenium hexafluoroantimonate and like triarylselenium salts, etc. These precursors of photo-setting catalysts are usable singly or at least two of them can be used in mixture in a desired ratio.

The proportion of the precursor of photo-setting catalyst is about 0.1 to about 5 parts by weight per 100 parts by weight of the cationically polymerizable, water-insoluble photopolymerizable substance.

The material for overcoat according to the invention may contain a radically polymerizable, water-insoluble photopolymerizable substance, when so required. Examples of radically polymerizable, water-insoluble photopolymerizable substances useful in the invention are polyester (meth)acrylate [e.g., reaction product of acrylic acid (methacrylic acid)/phthalic anhydride/-propyleneoxide, reaction product of acrylic acid (methacrylic acid)/diethylene glycol/adipic acid, reaction product of acrylic acid (methacrylic acid)/diethylene glycol/phthalic anhydride, etc.], epoxy (meth)acrylate [reaction product of bisphenol A, bisphenol S or bisphenol F/epichlorohydrin/acrylic acid (methacrylic acid), etc.], urethane (meth)acrylate [reaction product of diisocyanate/polyol/acrylic acid (methacrylic acid), etc.], etc.

The molecular weight of the radically polymerizable, water-insoluble photopolymerizable substance is not specifically limited. Yet preferred substances are those having a weight-average molecular weight in the range of about 1000 to about 100000.

The proportion of the radically polymerizable, water-insoluble photopolymerizable substance is 0 to about 50 parts by weight per 100 parts by weight of the water-soluble photopolymerizable substance.

The photopolymerizable resin composition of the present invention may further contain, when required, a polymerization inhibitor. Useful polymerization inhibitors include those conventionally used such as hydroquinone, p-methoxyphenol, p-benzoquinone, 2,4-dimethyl-6-t-butylphenol, naphthoquinone, N-nitrosophenylamine copper salts, etc.

The proportion of the polymerization inhibitor is about 0.001 to about 5 parts by weight, preferably about 0.01 to about 1 part by weight, per 100 parts by weight of the combined amount of the water-soluble photopolymerizable substance and the cationically polymerizable, water-insoluble photopolymerizable substance.

The material for overcoat according to the invention may further contain, when required, a photopolymerizable monomer. Useful photopolymerizable monomers include water-soluble or water-insoluble radically polymerizable monomers. Examples of water-soluble monomers are 2-hydroxyethyl (meth)acrylate, 2-hydroxypropyl (meth)acrylate, N-vinylpyrrolidone, polyethylene glycol di(meth)acrylate, melamine (meth)acrylate, N,N-dimethylacrylamide, N-methylolacrylamide, N,N-dimethylaminoethyl (meth)acrylate, etc. Examples of water-insoluble monomers are ethylene glycol di(meth)acrylate, triethylene glycol di(meth)acrylate, propylene glycol di(meth)acrylate, tripropylene glycol di(meth)acrylate, polypropylene glycol di(meth)acrylate, tetrahydrofuryl (meth)acrylate, trimethylolpropane di(meth)acrylate, trimethylolpropane tri(meth)acrylate, pentaerythritol tri(meth)acrylate, pentaerythritol tetra(meth)acrylate, dipentaerythritol penta(meth)acrylate, dipentaerythritol hexa(meth)acrylate, etc. The photopolymerizable monomers as exemplified above are usable singly or at least two of them can be used in mixture in a desired ratio. Preferably monofunctional and polyfunctional monomers are used in combination.

When the above photopolymerizable monomer is incorporated into the material for overcoat, the proportion of the monomer is about 5 to about 50 parts by weight per 100 parts by weight of the combined amount of the water-soluble photopolymerizable substance and the cationically polymerizable, water-insoluble photopolymerizable substance.

The material for overcoat according to the invention preferably contains all of the above components, i.e. a water-soluble photopolymerizable substance, a cationically polymerizable, water-insoluble photopolymerizable substance, a photopolymerizable monomer, a photopolymerization initiator, a precursor of photo-setting catalyst and a polymerization inhibitor in view of the durability of overcoat, particularly the resistance thereof to heat, acids and alkalis, etc.

The material for overcoat according to the invention may contain various organic solvents in addition to the foregoing components in order to adjust the viscosity. Examples of useful organic solvents are aromatic hydrocarbons such as xylene, toluene and the like, ketones such as acetone, methyl ethyl ketone and the like, cellosolves such as ethyl cellosolve, butyl cellosolve and the like, carbitols such as ethyl carbitol, butyl carbitol and the like, esters of acetic acids such as ethyl acetate, butyl acetate, cellosolve acetate, butyl cellosolve acetate, butyl carbitol acetate and the like, petroleum type hydrocarbons such as naphthas, etc. These solvents are used in an amount of about 10 to about 200 parts by weight per 100 parts by weight of the material for overcoat.

According to the invention, the material for color filter overcoat is applied to a transparent substrate having a color filter formed thereon, exposing the overcoat to light and conducting development using an aqueous solution of alkali to remove the unexposed portion, whereby a patterned overcoat is formed.

Useful transparent substrates include those usually used for liquid crystal display devices, such as those made of float glass, quartz glass or the like having a thickness of about 0.5 to about 5 mm.

Resin compositions useful for a color filter can be those usually used such as gelatin, casein, epoxy resins, acrylic resins, etc. The methods of forming the color filter are not specifically limited and include photolithography, printing or the like.

The methods of applying the material for overcoat are not specifically limited and include, for example, a spin coater method, roll coater method, etc. The thickness of the resin coating is 200 to 50000 Å on dry basis. The resin coating of less than 200 Å thickness is not satisfactory as a protective film, whereas a resin coating of more than 50000 Å thickness is likely to absorb light rays of short wavelength and to become colored. Thus a resin coating of a thickness outside of the above range is not desirable.

The methods of exposing to light the overcoat applied to the color filter in the above manner are not specifically limited. The exposure can be done by irradiation with ultraviolet light or visible light using a mercury-arc lamp, xenon lamp or the like, or with argon laser, excimer laser or like laser beams. The exposure value is usually 10 mJ/cm$^2$ or more, although the value is variable depending on the components of the resin composition used.

According to the invention, the unexposed portion of overcoat is developed using an aqueous solution of alkali. This means that handling is easy and the treatment is conducted in a favorable environment, as compared with the case wherein an organic solvent is used as a developer. The aqueous solution of alkali can be any of aqueous solutions of organic alkalis and inorganic alkalis.

Examples of useful aqueous solutions of organic alkalis are aqueous solutions of organic amines in a concentration of about 0.01 to about 10%, examples of organic amines being methylamine, dimethylamine, trimethylamine, ethylamine, diethylamine, triethylamine, diethanolamine, triethanolamine, etc.; an aqueous solution of tetramethylammonium hydroxide, in a concentration of about 0.01 to about 5%, which is commercially available as an alkali developer for a photoresist; an aqueous solution containing about 0.01 to about 0.5% of tetraalkylammonium halide such as tetramethylammonium chloride, tetraethylammonium chloride, tetramethylammonium bromide, tetraethylammonium bromide, tetramethylammonium iodide, tetraethylammonium iodide, etc. and about 0.1 to about 5% of inorganic alkali such as sodium hydroxide, potassium hydroxide, sodium carbonate or the like; and so forth.

Useful aqueous solutions of inorganic alkalis include, for example, an aqueous solution containing about 0.1 to about 5% of inorganic alkali such as sodium hydroxide, potassium hydroxide, sodium carbonate or the like.

The development can be conducted by dipping the coated substrate to be treated in an aqueous solution of alkali at room temperature for about 3 seconds to about 3 minutes.

According to the invention, the overcoat can be imparted improved resistance to heat and chemicals by carrying out either a developing method using an aqueous solution of organic alkali or a method comprising dipping in an aqueous solution of organic alkali after development using an aqueous solution of inorganic alkali. The improvement is achieved presumably because the organic component in the aqueous solution of developer acts as a phase transfer catalyst to thereby accelerate the reaction of epoxy group. Furthermore, the developer is not turbid and the method achieves stable development with little or no loss of resin coating as compared with treatment using only an aqueous solution of inorganic alkali.

The same aqueous solutions of inorganic alkalis and the same aqueous solutions of organic alkalis as exemplified above can be used in the method comprising dipping in an aqueous solution of organic alkali after development using an aqueous solution of inorganic alkali. This method is conducted by dipping the coated substrate in an aqueous solution of inorganic alkali at room temperature for about 3 seconds to about 3 minutes, followed by dipping in an aqueous solution of organic alkali at room temperature for about 3 seconds to about 3 minutes.

In the invention, it is desirable to conduct postcure by heating after development in order to fully cure the overcoat by cationic polymerization. The heat treatment is effected at about 100 to about 250° C. for about 30 to about 90 minutes. Without resort to the heat treatment, the same effect can be produced by a step to be executed later, namely the step of heating the substrate in forming a transparent electrode film in a vacuum chamber. Reversely if the heat treatment is performed for postcure, the step of heating the substrate in forming a transparent electrode film could be omitted.

In the case wherein postcure is effected by heating, the material for overcoat may contain a thermosetting hardener. Useful thermosetting hardeners include those which induce the reaction of epoxy group, for example, organic compounds such as amines, acid anhydrides, imidazoles, etc. The amount of the thermosetting hardener is about 1 to about 20 parts by weight, preferably about 5 to about 10 parts by weight, per 100 parts by weight of the cationically polymerizable, water-insoluble photopolymerizable substance. The amount of more than the above range causes the unexposed overcoat to partly remain after development and discolors the exposed coating portion, hence is undesirable.

The overcoat is formed by said process and a transparent electrode is formed on the overcoat, whereby an electrode plate for a liquid crystal display device is produced.

According to the invention, when a coloring agent is incorporated into the material for overcoat, the resulting material can be used as a material for a color filter.

Conventional organic pigments can be used as the coloring agent in the material for a color filter. Examples of useful organic pigments are red organic pigments such as high-molecular-weight azo-type, anthraquinone-type, and perylene-type pigments; yellow organic pigments such as high-molecular-weight azo type, isoindolinone type, anthraquinone type and metal complex azo type pigments; green organic pigments such as phthalocyanine type pigments; purple organic pigments such as dioxane type pigments; etc. Conventional dyes can be used in the case wherein heat resistance is not required.

The amount of the coloring agent used is about 5 to about 50 parts by weight, preferably about 10 to about 30 parts by weight, per 100 parts by weight of the material for overcoat.

A color filter can be produced from the foregoing color filter material, under the same conditions as in the method of forming the overcoat, by applying to the transparent substrate the material for a color filter containing a coloring agent, exposing the coating to light and effecting development with an aqueous solution of alkali for removal of the unexposed portion to form a color pattern. A color filter patterned with a plurality of colors is formed by repeating the above series of steps.

According to the invention, the color filter is imparted improved resistance to heat and chemicals, as is the case with the formation of overcoat, by carrying out either a developing method using an aqueous solution of organic alkali or a method comprising immersion in an aqueous solution of organic alkali after development using an aqueous solution of inorganic alkali.

The material for overcoat according to the invention or a suitable resin composition is applied to the color filter thus obtained in the invention, whereby an overcoat is formed.

In accordance with the invention, the overcoat for protection of color filter may be produced in the form of a single layer film or a multi-layer film formed from the same or different resin compositions. A metal film may be provided on or under the transparent electrode in contact therewith. A film of inorganic oxide such as silicate dioxide, zirconium oxide or the like may be formed on the transparent electrode or on the entire surface of the overcoat. It goes without saying that a black matrix (black pattern) may be formed from an organic or inorganic material to give an increased display contrast to the color filter.

According to the invention, there is provided a material for color filter overcoat which material is inexpensive and capable of forming an overcoat that can exhibit a high adhesion to a transparent electrode and a color filter both producible from various materials, and can display excellent resistance to acids, alkalis and heat without deteriorating the spectral characteristics nor the color of color filter.

Since a photosensitive resin composition is used, the peripheral portion of overcoat under the transparent electrode in the mounting area of electrical components can be removed by the developing treatment, whereby an overcoat can be formed only on the color filter, ensuring the production of a highly reliable mounted product. Because the development can be done using an aqueous solution of alkali, handling is easy and the treatment can be effected in a favorable working environment. When the development is performed using only an aqueous solution of organic alkali, the overcoat is improved in the resistance to heat, acids and alkalis, and it is possible to avoid the contamination of resin coating due to inorganic alkali (sodium ions, potassium ions, etc.).

The material for a color filter comprising the material for overcoat and a coloring agent facilitates the formation of a color pattern by photolithography and enables the production of a color filter excellent in the resistance to acids, alkalis and heat. When only an aqueous solution of organic alkali is used in the development, the material for a color filter makes it possible, as in the case of material for overcoat, to avoid the contamination of the color filter to be formed due to the inorganic alkali (sodium ions, potassium ions, etc.).

Figure 1:
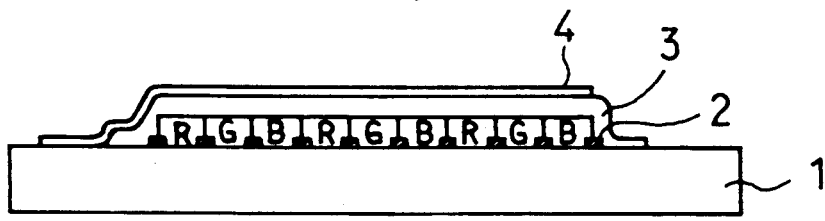
FIG. 1 is a schematic view in section of an electrode plate which is produced in Example 1 to be described later.

In the drawings, the following reference numerals indicate: (1), a transparent substrate; (2), a color filter; (3), (10), an overcoat; (4), a transparent electrode; (5), a green resin coating; (6), a green pattern; (7), a red resin coating; (8), a red pattern; and (9), a multi-color filter.

Figure 7:
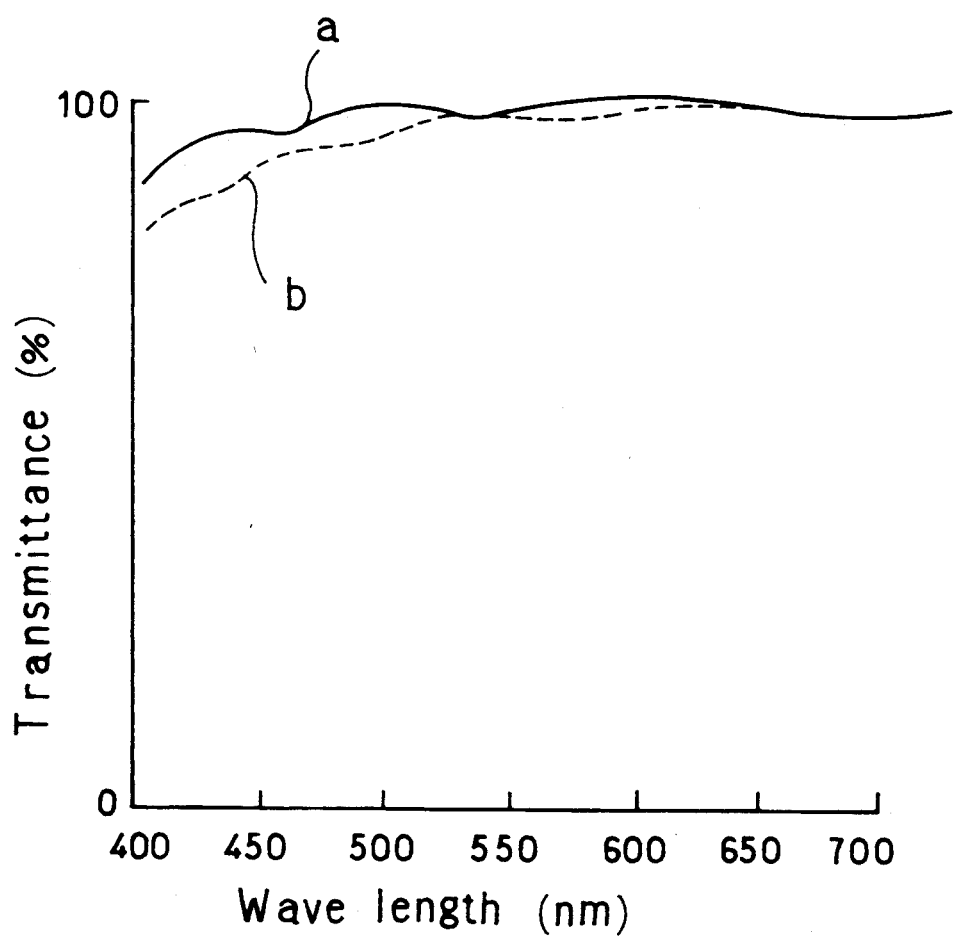

FIG. 7 is a graph showing the transmittance, in the range of visible light, of (a) an overcoat formed by the developing treatment of the present invention and (b) an overcoat formed by development using an aqueous solution of inorganic alkali.

EXAMPLES

The present invention will be described below in greater detail with reference to the following examples, but the invention is not limited to these examples.

EXAMPLE 1

A 390 g quantity of an epoxy resin ("YDPN-601", product of Tohto Kasei Co., Ltd.) and 108 g of an acrylic acid were dissolved in 750 g of 1,6-hexanediol diacrylate and the resulting solution was reacted at 100 to 150° C. for 2 hours in the presence of 0.5 g of hydroquinone and 3 g of methyltriethylammonium iodide. A 279 g quantity of HET acid anhydride was added to the reaction mixture and the mixture obtained was reacted at 100 to 150° C. for 2 hours, giving a water-soluble photopolymerizable oligomer. This oligomer will be hereinafter referred to as "the component (A-1-I)".

A 100 parts by weight quantity of the component (A-1-1), 40 parts by weight of a phenolic novolak epoxy resin ("YDCN-602", product of Tohto Kasei Co., Ltd.) as a water-insoluble photopolymerizable oligomer, 20 parts by weight of trimethylolpropane triacrylate ("TMP-A", product of Kyoeisha Chemical Co., Ltd.) as a photopolymerizable monomer, 5 parts by weight of "Irgacure 651" (product of Ciba-Geigy Corp.) as a photopolymerization initiator, 0.5 part by weight of diphenyliodonium hexafluoroantimonate as a precursor of a catalyst for photo-setting and 0.1 part by weight of hydroquinone as a polymerization inhibitor were kneaded in 500 parts by weight of butyl cellosolve acetate, giving an overcoating material (I).

Thereafter, an electrode plate for liquid crystal display devices as shown in FIG. 1 was formed. First, three color filters, i.e. red (R), green (G) and blue (B) filters were formed, by relief dyeing, on a transparent substrate (1) made of a float glass (blue plate) having a thickness of 1 mm. The thickness of each color filter was adjusted to about 1.8 μm. The overcoating material (I) was applied on the color filters to a dry film thickness of about 10000 Å by a roll coater and the coated filters were exposed to ultraviolet light at an exposure value of 200 mJ/cm². The unexposed portions were removed by developing using a 0.06% aqueous solution of tetramethylammonium hydroxide, whereby patterning of the overcoating material was performed so as to cover the color filters (2) in a rectangular form to produce an overcoat (3). Subsequently, a transparent electrode (4) called ITO was superposed thereon to a film thickness of 2400 Å by sputtering. Lastly, the transparent electrode was subjected to patterning by a usual etching method.

EXAMPLE 2

A 100 parts by weight quantity of the component (A-1-1) used in Example 1, 20 parts by weight of an epoxy acrylate ("Ripoxy VR-90", produce of Showa Highpolymer Co., Ltd.) as a water-insoluble photopolymerizable oligomer, 40 parts by weight of 2-hydroxyethyl acrylate as a photopolymerizable monomer, 5 parts by weight of "Irgacure 651" (product of Ciba-Geigy Corp.) as a photopolymerization initiator, 0.5 part by weight of diphenyliodonium hexafluoroantimonate as a precursor of a catalyst for photo-setting and 0.1 part by weight of hydroquinone as a polymerization inhibitor were kneaded in 500 parts by weight of butyl cellosolve acetate, giving an overcoating material (II).

Using the above overcoating material (II), an electrode plate was produced in the same manner as in Example 1.

EXAMPLE 3

A 260 g quantity of an epoxy resin ("YDPN-602", product of Tohto Kasei Co., Ltd.) and 72 g of methacrylic acid were dissolved in 500 g of ethylene glycol diacrylate. The resulting solution was reacted at 100 to 150° C. for 2 hours in the presence of 0.5 g of hydroquinone monomethyl ether and 3 g of methyltriethylammonim iodide. Thereafter, 186 g of phthalic anhydride was added to the reaction mixture and reacted at 100 to 150° C. for 2 hours, giving a water-soluble photopolymerizable oligomer. This oligomer thus obtained will be hereinafter called "the component (A-1-2)".

A 100 parts by weight quantity of the component (A-1-2), 20 parts by weight of cresol novolak-type epoxy resin ("YDCN-704", product of Tohto Kasei Co., Ltd.) as a water-insoluble phtpolymerizable oligomer, 10 parts by weight of neopentyl glycol diacrylate as a photopolymerizable monomer, 10 parts by weight of 2,4-dimethylthioxanthone as a photopolymerization initiator, 10 parts by weight of p-dimethylaminobenzoic acid methyl ester as a photopolymerization accelerator, 1.0 part by weight of triphenylsulfonium tetrafluoroborate as a precursor of a catalyst for photosetting and 0.1 part by weight of copper salt of N-nitrosophenylamine as a polymerization inhibitor were kneaded in 500 parts by weight of butyl carbitol acetate, giving a resin composition (I).

Figure 2:
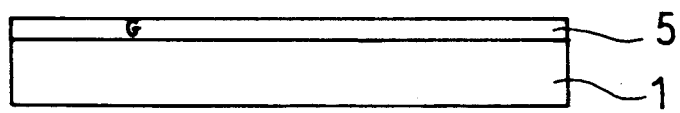
FIGS. 2 to 5 are schematic views in section of an electrode plate being produced, the finished electrode plate being one which is produced in Example 3 to be described later.
Figure 3:
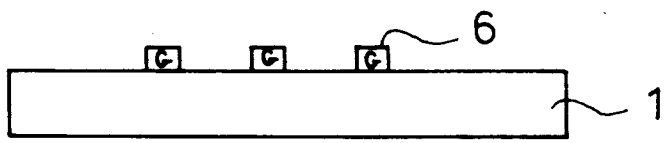
Figure 4:
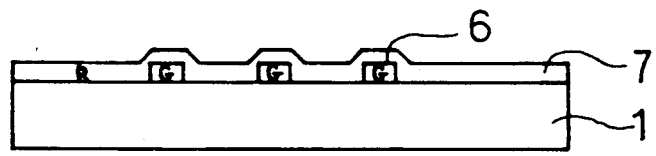
Figure 5:
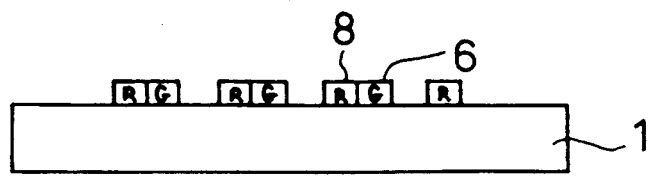
Figure 6:
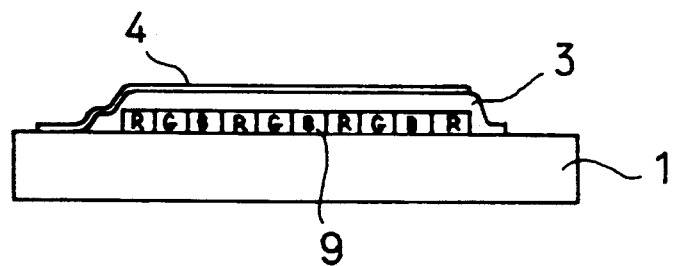
FIG. 6 is a schematic view in section of an electrode plate which is produced in Example 3 to be described later.

As shown in FIG. 2, a color-filter material prepared by dispersing 20 parts by weight of a green pigment of phthalocyanine-type in 100 parts by weight of the above resin composition (I) was applied on the whole surface of a transparent substrate (1) made of a float glass (blue plate) having a thickness of 1 mm to a dry film thickness of about 15000 Å to form a green resin layer (5). Subsequently, the coated substrate was exposed to ultraviolet light through a mask pattern at an exposure value of 200 mJ/cm², whereby the necessary portions only were exposed to the light. Thereafter, development was conducted using a 0.08% aqueous solution of tetramethylammonium hydroxide to remove the unnecessary portions, whereby a green pattern (6) as shown in FIG. 3 was formed. Next, a color-filter material prepared by dispersing 20 parts by weight of a red pigment of high-molecular-weight azo-type in 100 parts by weight of the resin composition (I) was applied on the green pattern obtained above to a dry film thickness of about 15000 Å to form a red resin layer (7) (FIG. 4). Exposure to ultraviolet light and development were conducted in the same manner as above to obtain a red pattern (8) and a green pattern (6) as shown in FIG. 5. In the same manner as above, a blue pattern was further formed to produce a multi-color filter (9) as shown in FIG. 6. The overcoating material (I) as used in Example 1 was applied on the color filter (9) to a dry film thickness of about 10000 Å. Exposure to ultraviolet light and development were carried out in the same manner as in Example 1 to form an overcoat (3). Thereafter, a transparent electrode (4) was superposed on the resin film, and the transparent electrode was subjected to patterning by etching to produce an electrode plate for liquid crystal display devices.

EXAMPLE 4

A 100 parts by weight quantity of the component (A-1-2) as used in Example 3, 20 parts by weight of epoxy acrylate ("Ripoxy VR-90", product of Showa Highpolymer Co., Ltd.) as a water-insoluble photopolymerizable oligomer, 40 parts by weight of 2-hydroxyethyl acrylate as a photopolymerizable monomer, 10 parts by weight of "Irgacure 651" (product of Ciba-Geigy Corp.) as a pohtopolymerization initiator, 1.0 part by weight of triphenylsulfonium tatrafluoroborate as a precursor of a catalyst for photo-setting and 0.1 part by weight of hydroquinone as a polymerization inhibitor were kneaded in 500 parts by weight of butyl carbitol acetate, giving a resin composition (II).

Using the resin composition (II) obtained, an electrode plate was produced in the same manner as in Example 3.

TEST EXAMPLE 1

The overcoat obtained in Example 1 was subjected to heat treatment at 250° C. for 30 minutes, and the transmittance was measured in the visible-light area (the curve a in FIG. 7). Apart from this procedure, an overcoat was produced by using the same ingredients as used in Example 1 and conducting the development with use of only an aqueous solution of inorganic alkali (1.5% aqueous solution of sodium carbonate) and the transmittance was measured similarly (the curve b in FIG. 7). The overcoat obtained after the development with the aqueous solution of inorganic alkali tended to readily absorb light rays having a short wavelength to impair the spectral characteristics. In contrast, the overcoat produced by way of the development according to the method of the present invention was less likely to absorb light rays having a short wavelength, whereby the spectral characteristics were free from deterioration.

We claim:

1. A material for overcoat on a color filter for liquid crystal display, characterized in that the material comprises a water-soluble photopolymerizable substance, a cationically polymerizable, water-insoluble photopolymerizable substance, a photopolymerization initiator and a precursor of photo-setting catalyst.

2. A material for overcoat on a color filter according to claim 1 which contains a polymerization inhibitor.

3. A material for overcoat on a color filter according to claim 1 which contains a photopolymerizable monomer.

4. A process for forming an overcoat on a color filter for liquid crystal display, characterized in that the process comprises the steps of applying a material for color filter overcoat to a transparent substrate having a color filter formed thereon, subjecting the overcoat to exposure to light and performing development using an aqueous solution of alkali, the material for color filter overcoat comprising a water-soluble photopolymerizable substance, a cationically polymerizable, water-insoluble photopolymerizable substance, a photopolymerization initiator and a precursor of photo-setting catalyst.

5. A process according to claim 4 wherein the development using an aqueous solution of alkali is conducted by a method using an aqueous solution of organic alkali or by a method comprising dipping in an aqueous solution of organic alkali after dipping in an aqueous solution of inorganic alkali.

6. A material for a color filter for liquid crystal display, characterized in that the material comprises a water-soluble photopolymerizable substance, a cationically polymerizable, water-insoluble photopolymerizable substance, a photopolymerization initiator, a precursor of photo-setting catalyst and a coloring agent.

7. A material for a color filter according to claim 6 which contains a polymerization inhibitor.

8. A material for a color filter according to claim 6 which contains a photopolymerizable monomer.

9. A process for forming a color filter for liquid crystal display, characterized in that the process comprises the steps of applying a material for color filter to a transparent substrate, subjecting the coating to exposure to light, and conducting development with an aqueous solution of alkali, the material for color filter comprising a water-soluble photopolymerizable substance, a cationically polymerizable, water-insoluble photopolymerizable substance, a photopolymerization initiator, a precursor of photo-setting catalyst and a coloring agent.

10. A process according to claim 9 wherein the development using an aqueous solution of alkali is conducted by a method using an aqueous solution of organic alkali or by a method comprising dipping in an aqueous solution of organic alkali after dipping in an aqueous solution of inorganic alkali.

* * * * *